United States Patent
Yang

(10) Patent No.: US 11,704,234 B2
(45) Date of Patent: Jul. 18, 2023

(54) METHOD FOR ACCESSING FLASH MEMORY MODULE AND ASSOCIATED PACKAGE

(71) Applicant: Silicon Motion, Inc., Hsinchu County (TW)

(72) Inventor: Tsung-Chieh Yang, Hsinchu (TW)

(73) Assignee: Silicon Motion, Inc., Hsinchu County (TW)

( * ) Notice: Subject to any disclaimer, the term of this patent is extended or adjusted under 35 U.S.C. 154(b) by 197 days.

(21) Appl. No.: 16/860,093

(22) Filed: Apr. 28, 2020

(65) Prior Publication Data
US 2021/0334202 A1    Oct. 28, 2021

(51) Int. Cl.
| G06F 12/02 | (2006.01) |
| G11C 16/28 | (2006.01) |
| G11C 16/08 | (2006.01) |
| G11C 16/04 | (2006.01) |
| G06F 3/06 | (2006.01) |
| G06F 9/4401 | (2018.01) |

(52) U.S. Cl.
CPC .......... *G06F 12/0246* (2013.01); *G06F 3/064* (2013.01); *G06F 3/0608* (2013.01); *G06F 3/0634* (2013.01); *G06F 3/0659* (2013.01); *G06F 3/0679* (2013.01); *G06F 9/4401* (2013.01); *G11C 16/0483* (2013.01); *G11C 16/08* (2013.01); *G11C 16/28* (2013.01); *G06F 2212/7201* (2013.01)

(58) Field of Classification Search
USPC ........................................................ 711/170
See application file for complete search history.

(56) References Cited

U.S. PATENT DOCUMENTS

| 7,237,074 B2* | 6/2007 | Guterman .............. G11C 16/26 711/156 |
| 10,705,746 B2* | 7/2020 | Kim ........................ G06F 3/064 |
| 2008/0086631 A1* | 4/2008 | Chow ..................... G06F 8/654 713/2 |
| 2010/0023655 A1* | 1/2010 | Hirayama ............. G06F 3/0656 710/33 |
| 2013/0107625 A1* | 5/2013 | Yang .................. G11C 11/5628 365/185.03 |

(Continued)

FOREIGN PATENT DOCUMENTS

| CN | 109979514 A | * | 7/2019 |
| TW | 201732597 A | | 9/2017 |

*Primary Examiner* — Sanjiv Shah
*Assistant Examiner* — Elias Young Kim
(74) *Attorney, Agent, or Firm* — Winston Hsu

(57) ABSTRACT

The present invention provides a method for accessing a flash memory module is disclosed, wherein the flash memory module includes at least one flash memory chip, each flash memory chip includes a plurality of block, each block is implemented by a plurality of word lines, each word line corresponds to K pages, and each word line includes a plurality of memory cells supporting a plurality of states, and the method includes the steps of: receiving data from a host device; generating dummy data; and writing the data with the dummy data to a plurality of specific blocks, wherein for each of a portion of the word lines of the specific blocks, the dummy data is written into at least one of the K pages, and the data from the host device is written into the other page(s) of the K pages.

18 Claims, 7 Drawing Sheets

(56) References Cited

U.S. PATENT DOCUMENTS

| | | | |
|---|---|---|---|
| 2015/0078079 A1* | 3/2015 | D'Abreu | G11C 11/5628 |
| | | | 365/185.03 |
| 2015/0234609 A1* | 8/2015 | Yang | G06F 12/0246 |
| | | | 711/103 |
| 2015/0294723 A1* | 10/2015 | Choi | G11C 11/5671 |
| | | | 365/185.03 |
| 2017/0199685 A1* | 7/2017 | Kim | G06F 3/0656 |
| 2019/0065363 A1* | 2/2019 | Moon | G06F 12/0246 |
| 2019/0187923 A1* | 6/2019 | Kim | G06F 3/0659 |

* cited by examiner

METHOD FOR ACCESSING FLASH MEMORY MODULE AND ASSOCIATED PACKAGE

BACKGROUND OF THE INVENTION

1. Field of the Invention

The present invention relates to a flash memory, and more particularly, to an embedded Multi-Media-Card (eMMC) comprising a flash memory controller and a flash memory module.

2. Description of the Prior Art

An eMMC is a popular storage component for many electronic devices such as smart phones, tablets and notebook. The eMMC within the electronic device is pre-processed to have boot code, operating system (OS) code and digital contents in the factory, and the user can immediately use the electronic device after getting it.

For quickly writing the boot code, the OS code and digital contents to the eMMC, the eMMC is connected to a socket or a tool for the data writing, then the eMMC is mounted on the printed circuit board (PCB) that is to be used in the electronic device. However, a wave soldering process may be performed to make the eMMC be mounted on the PCB, and because the wave soldering process has higher temperature, the data recorded in the eMMC may be damaged or the data quality may be worsened.

SUMMARY OF THE INVENTION

It is therefore an objective of the present invention to provide a method for accessing a flash memory module and associated eMMC, which can increase the data robustness of the eMMC, to solve the above-mentioned limitation.

According to one embodiment of the present invention, a method for accessing a flash memory module is disclosed, wherein the flash memory module comprises at least one flash memory chip, each flash memory chip comprises a plurality of block, each block is implemented by a plurality of word lines, each word line corresponds to K pages, and each word line comprises a plurality of memory cells supporting a plurality of states, and the method comprises the steps of: receiving data from a host device; generating dummy data according to the data received from the host device; and writing the data with the dummy data to a plurality of specific blocks, wherein for each of a portion of the word lines of the specific blocks, the dummy data is written into at least one of the K pages, and the data from the host device is written into the other page(s) of the K pages.

According to one embodiment of the present invention, a package comprising a flash memory module and a flash memory controller is disclosed. The flash memory module comprises at least one flash memory chip, each flash memory chip comprises a plurality of block, each block is implemented by a plurality of word lines, each word line corresponds to K pages, and each word line comprises a plurality of memory cells supporting a plurality of states. The flash memory controller, coupled to the flash memory module, configured to receive data from a host device, generate dummy data according to the data received from the host device, and write the data with the dummy data to a plurality of specific blocks; wherein for each of a portion of the word lines of the specific blocks, the dummy data is written into at least one of the K pages, and the data from the host device is written into the other page(s) of the K pages These and other objectives of the present invention will no doubt become obvious to those of ordinary skill in the art after reading the following detailed description of the preferred embodiment that is illustrated in the various figures and drawings.

DETAILED DESCRIPTION

Figure 1:
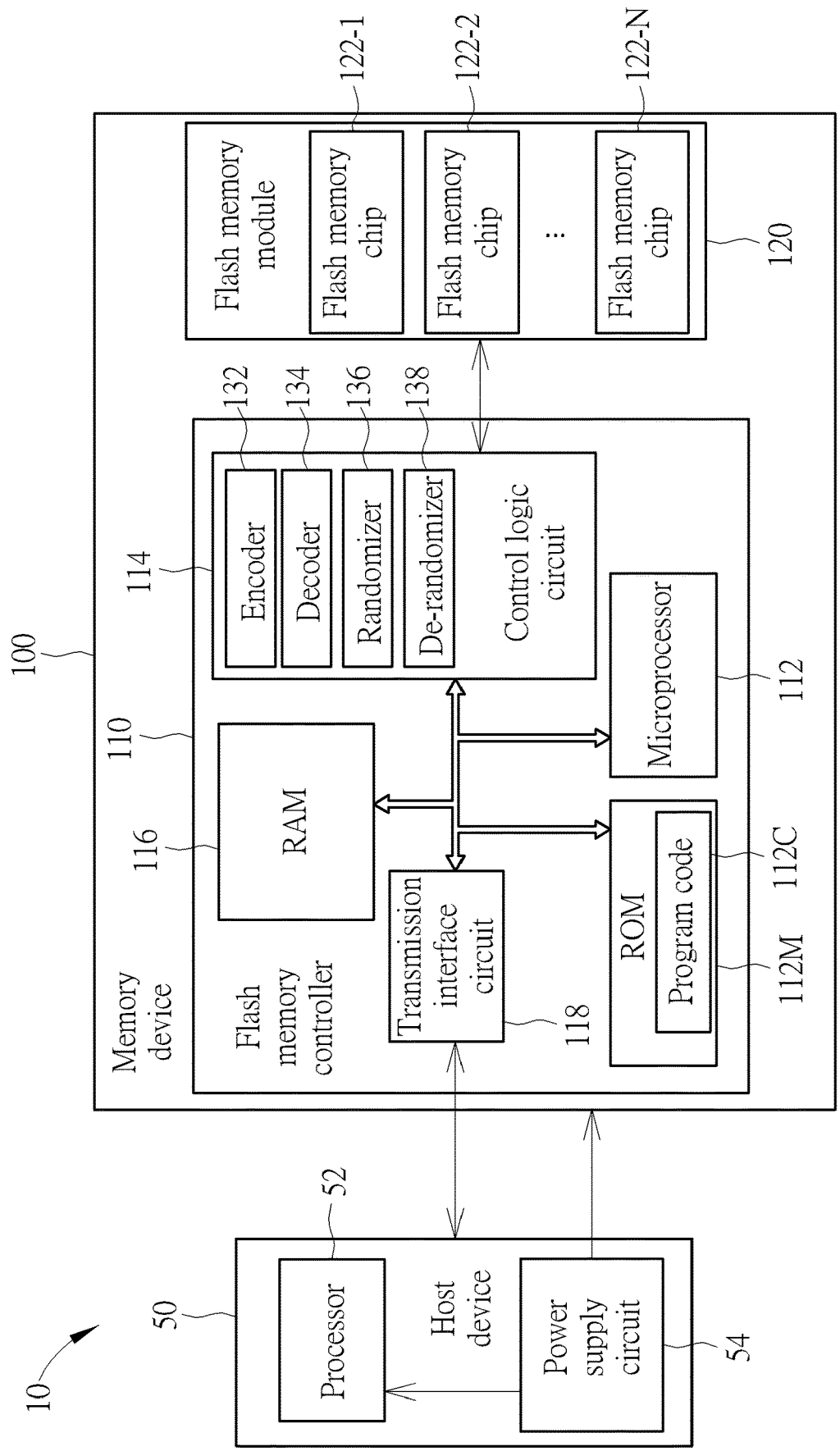
FIG. 1 is a diagram of an electronic device according to an embodiment of the present invention.

FIG. 1 is a diagram of an electronic device 10 according to an embodiment of the present invention, where the electronic device 10 may comprise a host device 50 and a memory device 100. The host device 50 may comprise at least one processor (e.g. one or more processors) which may be collectively referred to as the processor 52, and may further comprise a power supply circuit 54 coupled to the processor 52. The processor 52 is arranged for controlling operations of the host device 50, and the power supply circuit 54 is arranged for providing power to the processor 52 and the memory device 100, and outputting one or more driving voltages to the memory device 100. The memory device 100 may be arranged for providing the host device 50 with storage space, and obtaining the one or more driving voltages from the host device 50 as power source of the memory device 100. In this embodiment, the memory device may be an eMMC; and when the eMMC is in the factory, the host device 50 may be a data writing machine for writing the boot code, the OS code and the digital contents and any other required data to the eMCC; and when the eMMC is counted on the PCB and positioned in the electronic device such as a cell phone, a tablet or any other portable electronic device, the host device 50 may be a processor. According to this embodiment, the memory device 100 may comprise a flash memory controller 110, and may further comprise a flash memory module 120, where the flash controller 110 is arranged to control operations of the memory device 100 and access the flash memory module 120, and the flash memory module 120 is arranged to store information. The flash memory module 120 may comprise at least one flash memory chip such as a plurality of flash memory chips 122-1, 122-2, . . . , and 122-N, where "N" may represent a positive integer that is greater than one.

As shown in FIG. 1, the flash memory controller 110 may comprise a processing circuit such as a microprocessor 112, a storage unit such as a read-only memory (ROM) 112M, a control logic circuit 114, a random-access memory (RAM) 116, and a transmission interface circuit 118, where the above components may be coupled to one another via a bus. The RAM 116 is implemented by a Static RAM (SRAM), but the present invention is not limited thereto. The RAM 116 may be arranged to provide the memory controller 110 with internal storage space. For example, the RAM 116 may be utilized as a buffer memory for buffering data. In addition, the ROM 112M of this embodiment is arranged to store a program code 112C, and the microprocessor 112 is arranged to execute the program code 112C to control the access of the flash memory 120. Note that, in some examples, the program code 112C may be stored in the RAM 116 or any type of memory. Further, the control logic circuit 114 may be arranged to control the flash memory module 120, and may comprise an encoder 132, a decoder 134, a randomizer 136, a de-randomizer 138 and other circuits. The transmission interface circuit 118 may conform to a specific communications specification (e.g. Serial Advanced Technology Attachment (Serial ATA, or SATA) specification, Peripheral Component Interconnect (PCI) specification, Peripheral Component Interconnect Express (PCIe) specification, UFS specification, etc.), and may perform communications according to the specific communications specification, for example, perform communications with the host device 50 for the memory device 100, where the host device 50 may comprise the corresponding transmission interface circuit conforming to the specific communications specification, for performing communications with the memory device 100 for the host device 50.

In this embodiment, the host device 50 may transmit host commands and corresponding logical addresses to the memory controller 110 to access the memory device 100. The memory controller 110 receives the host commands and the logical addresses, and translates the host commands into memory operating commands (which may be simply referred to as operating commands), and further controls the flash memory module 120 with the operating commands to perform reading, writing/programing, etc. on memory units (e.g. data pages) having physical addresses within the flash memory module 120, where the physical addresses correspond to the logical addresses. When the flash memory controller 110 perform an erase operation on any flash memory chip 122-$n$ of the plurality of NV memory elements 122-1, 122-2, ..., and 122-N (in which "n" may represent any integer in the interval [1, N]), at least one block of multiple blocks of the flash memory chip 122-$n$ may be erased, where each block of the blocks may comprise multiple pages (e.g. data pages), and an access operation (e.g. reading or writing) may be performed on one or more pages.

Figure 2:
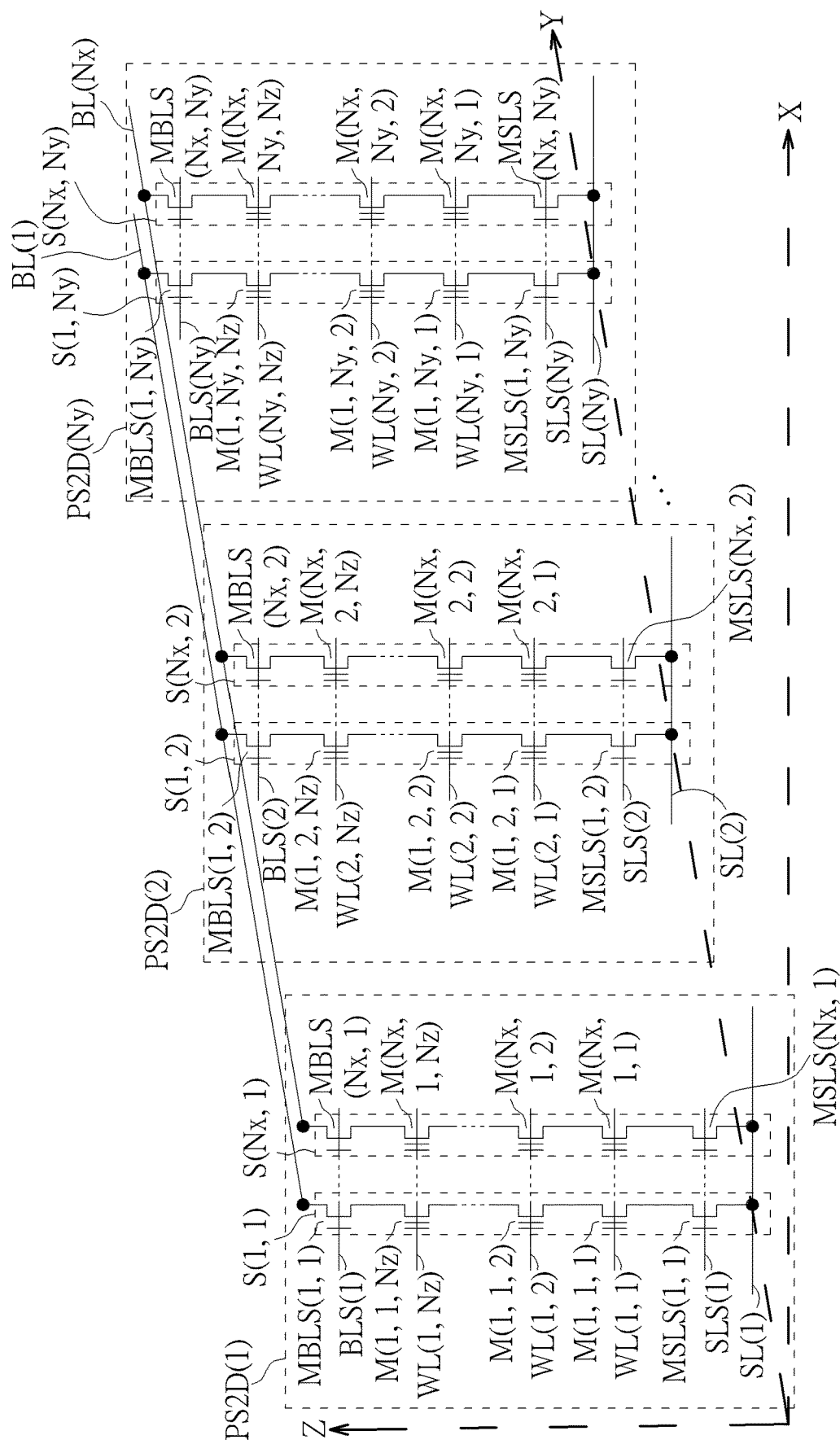
FIG. 2 is a diagram of a three-dimensional (3D) NAND flash memory according to an embodiment of the present invention.

FIG. 2 is a diagram of a three-dimensional (3D) NAND flash memory according to an embodiment of the present invention. For example, any memory element within the aforementioned at least one of the flash memory chips 122-1, 122-2, ..., and 122-N, may be implemented based on the 3D NAND flash memory shown in FIG. 2, but the present invention is not limited thereto.

According to this embodiment, the 3D NAND flash memory may comprise a plurality of memory cells arranged in a 3D structure, such as (Nx*Ny*Nz) memory cells {{M(1, 1, 1), ..., M(Nx, 1, 1)}, {M(1, 2, 1), ..., M(Nx, 2, 1)}, ..., {M(1, Ny, 1), ..., M(Nx, Ny, 1)}}, {{M(1, 1, 2), ..., M(Nx, 1, 2)}, {M(1, 2, 2), ..., M(Nx, 2, 2)}, ..., {M(1, Ny, 2), ..., M(Nx, Ny, 2)}}, ..., and {{M(1, 1, Nz), ..., M(Nx, 1, Nz)}, {M(1, 2, Nz), ..., M(Nx, 2, Nz)}, ..., {M(1, Ny, Nz), ..., M(Nx, Ny, Nz)}} that are respectively arranged in Nz layers perpendicular to the Z-axis and aligned in three directions respectively corresponding to the X-axis, the Y-axis, and the Z-axis, and may further comprise a plurality of selector circuits for selection control, such as (Nx*Ny) upper selector circuits {MBLS(1, 1), ..., MBLS(Nx, 1)}, {MBLS(1, 2), ..., MBLS(Nx, 2)}, ..., and {MBLS(1, Ny), ..., MBLS(Nx, Ny)} that are arranged in an upper layer above the Nz layers and (Nx*Ny) lower selector circuits {MSLS(1, 1), ..., MSLS(Nx, 1)}, {MSLS(1, 2), ..., MSLS(Nx, 2)}, ..., and {MSLS(1, Ny), ..., MSLS(Nx, Ny)} that are arranged in a lower layer below the Nz layers. In addition, the 3D NAND flash memory may comprise a plurality of bit lines and a plurality of word lines for access control, such as Nx bit lines BL(1), ..., and BL(Nx) that are arranged in a top layer above the upper layer and (Ny*Nz) word lines {WL(1, 1), WL(2, 1), ..., WL(Ny, 1)}, {WL(1, 2), WL(2, 2), ..., WL(Ny, 2)}, ..., and {WL(1, Nz), WL(2, Nz), ..., WL(Ny, Nz)} that are respectively arranged in the Nz layers. Additionally, the 3D NAND flash memory may comprise a plurality of selection lines for selection control, such as Ny upper selection lines BLS(1), BLS(2), ..., and BLS(Ny) that are arranged in the upper layer and Ny lower selection lines SLS(1), SLS(2), ..., and SLS(Ny) that are arranged in the lower layer, and may further comprise a plurality of source lines for providing reference levels, such as Ny source lines SL(1), SL(2), ..., and SL(Ny) that are arranged in a bottom layer below the lower layer.

As shown in FIG. 2, the 3D NAND flash memory may be divided into Ny circuit modules PS2D(1), PS2D(2), ..., and PS2D(Ny) distributed along the Y-axis. For better comprehension, the circuit modules PS2D(1), PS2D(2), ..., and PS2D(Ny) may have some electrical characteristics similar to that of a planar NAND flash memory having memory cells arranged in a single layer, and therefore may be regarded as pseudo-2D circuit modules, respectively, but the present invention is not limited thereto. In addition, any circuit module PS2D(ny) of the circuit modules PS2D(1), PS2D(2), ..., and PS2D(Ny) may comprise Nx secondary circuit modules S(1, ny), ..., and S(Nx, ny), where "ny" may represent any integer in the interval [1, Ny]. For example, the circuit module PS2D(1) may comprise Nx secondary circuit modules S(1, 1), ..., and S(Nx, 1), the circuit module PS2D(2) may comprise Nx secondary circuit modules S(1, 2), ..., and S(Nx, 2), ..., and the circuit module PS2D(Ny) may comprise Nx secondary circuit modules S(1, Ny), ..., and S(Nx, Ny). In the circuit module PS2D(ny), any secondary circuit module S(nx, ny) of the secondary circuit modules S(1, ny), ..., and S(Nx, ny) may comprise Nz memory cells M(nx, ny, 1), M(nx, ny, 2), ..., and M(nx, ny, Nz), and may comprise a set of selector circuits corresponding to the memory cells M(nx, ny, 1), M(nx, ny, 2), ..., and M(nx, ny, Nz), such as the upper selector circuit MBLS(nx, ny) and the lower selector circuit MSLS(nx, ny), where "nx" may represent any integer in the interval [1, Nx]. The upper selector circuit MBLS(nx, ny) and the lower selector circuit MSLS(nx, ny) and the memory cells M(nx, ny, 1), M(nx, ny, 2), ..., and M(nx, ny, Nz) may be implemented with transistors. For example, the upper selector circuit MBLS(nx, ny) and the lower selector circuit MSLS(nx, ny) may be implemented with ordinary transistors without any floating gate, and any memory cell M(nx, ny, nz) of the memory cells M(nx, ny, 1), M(nx, ny, 2), ..., and M(nx, ny, Nz) may be implemented with a floating gate transistor, where "nz" may represent any integer in the interval [1, Nz], but the present invention is not limited thereto. Further, the upper selector circuits MBLS(1, ny), . . . , and MBLS(Nx, ny) in the circuit module PS2D(ny) may perform selection according to the selection signal on the corresponding selection line BLS(ny), and the lower selector circuits MSLS(1, ny), . . . , and MSLS(Nx, ny) in the circuit module PS2D(ny) may perform selection according to the selection signal on the corresponding selection line SLS(ny).

In the flash memory module 120, when the block of any one of the flash memory chips 122-1-122-N serves as a single-level cell (SLC) block, each of the physical pages within the block correspond to one logical page, that is each of the memory cells of the page is configured to store only one bit, wherein one physical page may comprise all of the transistors controlled by a word line(e.g. the memory cells M(1, 1, Nz)–M(Nx, 1, Nz) corresponding to the word line WL(1, Nz) form a physical page). When the block of any one of the flash memory chips 122-1-122-N serves as an multiple-level cell (MLC) block, each of the physical pages within the block correspond to two logical pages, that is each of the memory cells of the page is configured to store two bits. When the block of any one of the flash memory chips 122-1-122-N serves as a triple-level cell (TLC) block, each of the physical pages within the block correspond to three logical pages, that is each of the memory cells of the page is configured to store three bits. When the block of any one of the flash memory chips 122-1-122-N serves as a quad-level cell (QLC) block, each of the physical pages within the block correspond to four logical pages, that is each of the memory cells of the page is configured to store four bits.

Figure 3:
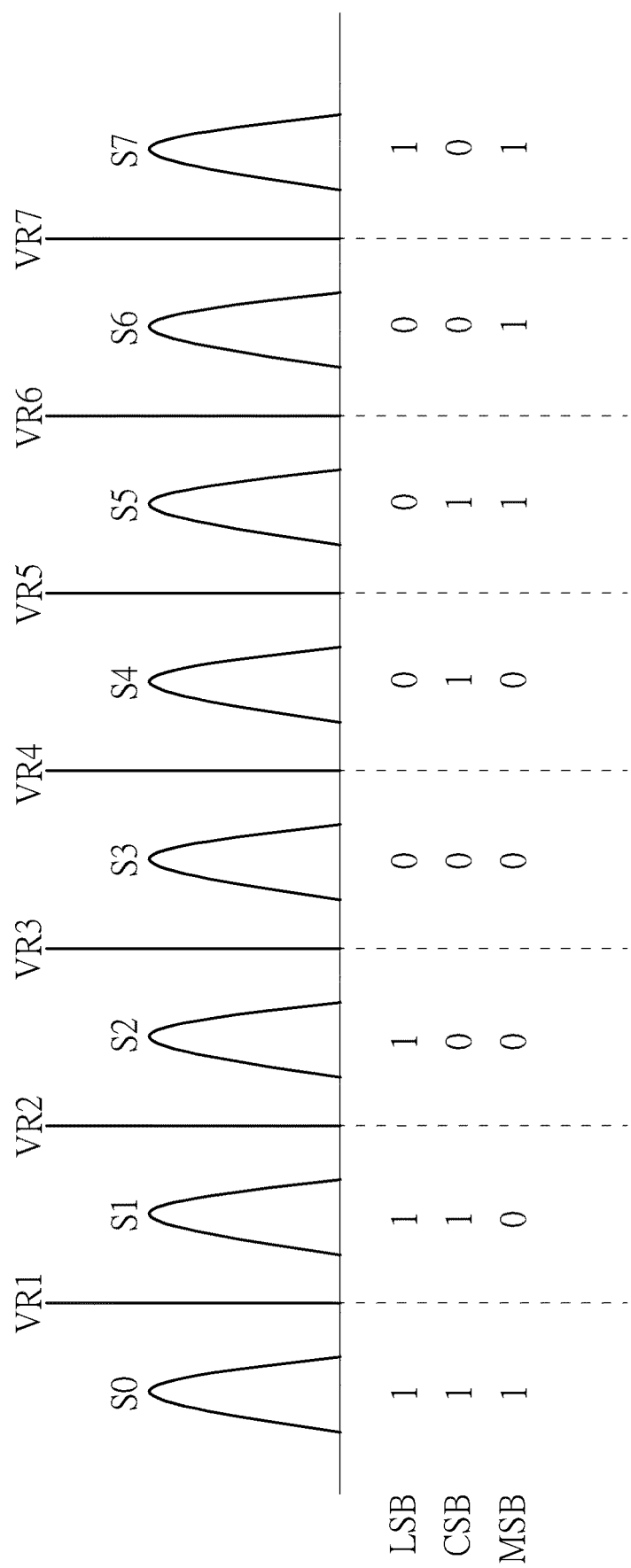
FIG. 3 is a diagram illustrating a plurality of states (program states) of a memory cell of the TLC block according to one embodiment of the present invention.

FIG. 3 is a diagram illustrating a plurality of states (program states) of a memory cell of the TLC block according to one embodiment of the present invention. As shown in FIG. 3, each memory cell can have eight states, and each state represents different combinations of three bits that are named as a least significant bit (LSB), a middle significant bit (MSB) and a most significant bit (MSB). In the embodiment shown in FIG. 3, when the memory cell is programmed to have the state S0, the LSB, the CSB and the MSB stored in the memory cell are (1, 1, 1); when the memory cell is programmed to have the state S1, the LSB, the CSB and the MSB stored in the memory cell are (1, 1, 0); when the memory cell is programmed to have the state S2, the LSB, the CSB and the MSB stored in the memory cell are (1, 0, 0); when the memory cell is programmed to have the state S3, the LSB, the CSB and the MSB stored in the memory cell are (0, 0, 0); when the memory cell is programmed to have the state S4, the LSB, the CSB and the MSB stored in the memory cell are (0, 1, 0); when the memory cell is programmed to have the state S5, the LSB, the CSB and the MSB stored in the memory cell are (0, 1, 1); when the memory cell is programmed to have the state S6, the LSB, the CSB and the MSB stored in the memory cell are (0, 0, 1); and when the memory cell is programmed to have the state S1, the LSB, the CSB and the MSB stored in the memory cell are (1, 0, 1).

When the LSB is required to be read by the flash memory controller 110, the flash memory controller 110 can control the flash memory module 120 to apply two read voltages VR3 and VR7 to read the memory cell. If the memory cell is conductive when the read voltage VR7 is applied or the memory cell is not conductive when the read voltage VR3, the LSB is determined to be "1"; if the memory cell is not conductive when the read voltage VR7 is applied, and the memory cell is conductive when the read voltage VR3 is applied, the LSB is determined to be "0". When the CSB is required to be read by the flash memory controller 110, the flash memory controller 110 can control the flash memory module 120 to apply three read voltages VR2, VR4 and VR6 to read the memory cell. If the memory cell is not conductive when the read voltage VR2 is applied, the CSB is determined to be "1"; if the memory cell is not conductive when the read voltage VR4 is applied, and the memory cell is conductive when the read voltage VR2 is applied, the CSB is determined to be "0"; if the memory cell is not conductive when the read voltage VR6 is applied, and the memory cell is conductive when the read voltage VR4 is applied, the CSB is determined to be "1"; and if the memory cell is conductive when the read voltage VR6 is applied, the CSB is determined to be "0". When the MSB is required to be read by the flash memory controller 110, the flash memory controller 110 can control the flash memory module 120 to apply two read voltages VR1 and VR5 to read the memory cell. If the memory cell is conductive when the read voltage VR5 is applied or the memory cell is not conductive when the read voltage VR1, the LSB is determined to be "1"; if the memory cell is not conductive when the read voltage VR5 is applied, and the memory cell is conductive when the read voltage VR1 is applied, the LSB is determined to be "0".

In the embodiment shown in FIG. 3, the LSBs of the memory cells of a single word line form a LSB page (logical page), the CSBs of the memory cells of the single word line form a CSB page (logical page), and the MSBs of the memory cells of the single word line form the MSB page (logical page). That is, each word line of the TLC block has three pages: the LSB page, the CSB page and the MSB page.

It is noted that the gray code shown in FIG. 3 is for illustratively only, and it's not a limitation of the present invention. Any suitable gray code can be used in the memory device 100, and the read voltages for determining the LAB, the CSB and the MSB may be changed accordingly.

As shown in FIG. 3, because a voltage difference between every two adjacent states is small, the flash memory module 120 may easily suffer the data quality issue due the voltage shifting of the states, especially when the memory device 100 is under high temperature such as the wave soldering process. Therefore, to increase the data robustness of the flash memory module 120, the data is written into only one or two pages of each word line to make the states have larger interval before the memory device 100 is mounted on the PCB and positioned in the electronic device. Then, after the memory device 100 is positioned in the electronic device and under better environment, the flash memory controller 110 can perform a garbage collection operation on the flash memory module 12 to rearrange the data, to increase the data density and release the memory space.

Figure 4:
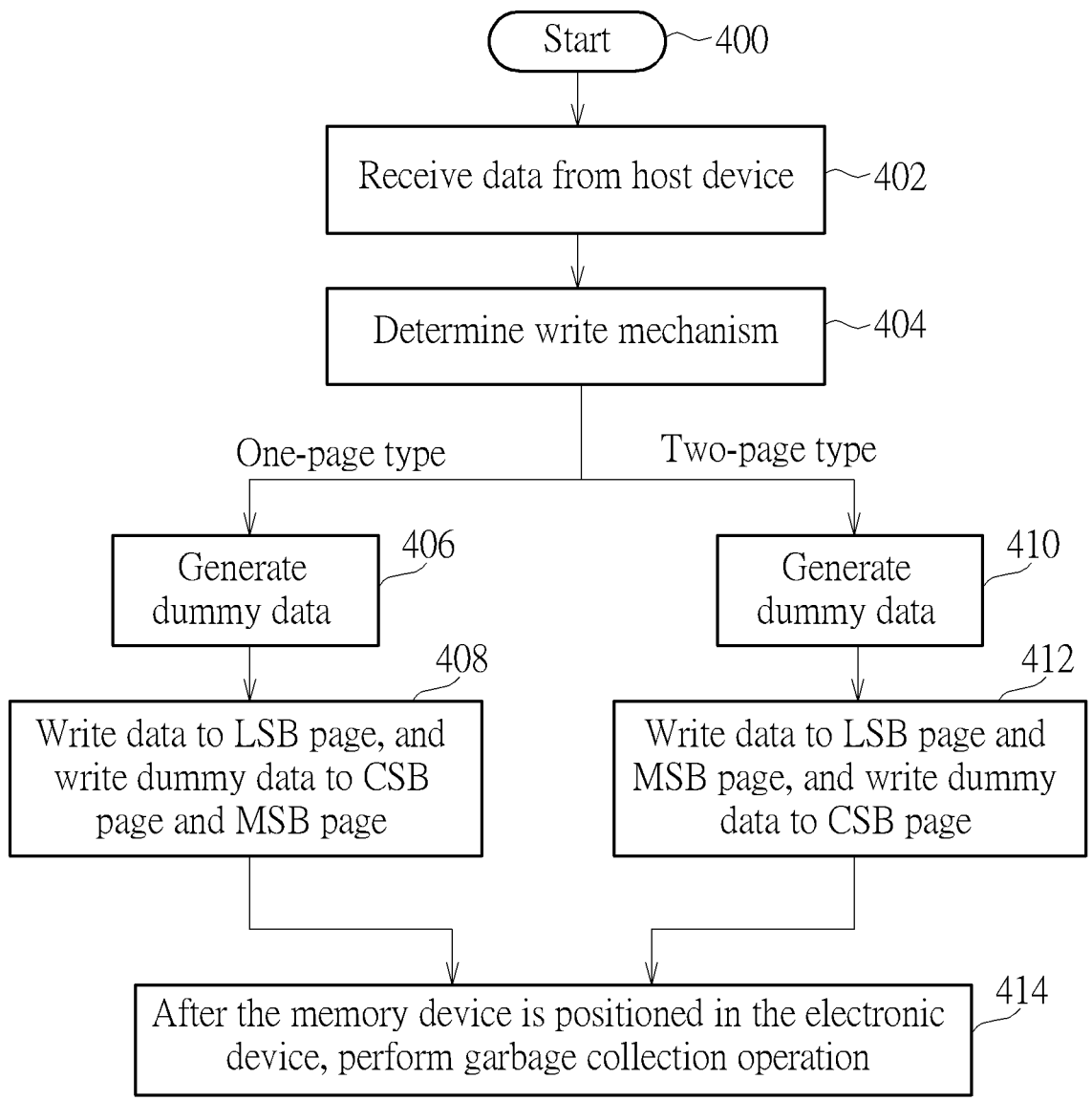
FIG. 4 is a diagram illustrating a method for accessing the flash memory module according to one embodiment of the present invention.

Specifically, FIG. 4 is a diagram illustrating a method for accessing the flash memory module 120 according to one embodiment of the present invention. In Step 400, the flow starts, the memory device 100 is connected to the host device 50, and the host device 50 prepares to write data into the memory device 100. In this embodiment, the memory device 100 is a single package such as the eMMC, that is the memory device 100 is not mounted on the PCB and not positioned in the electronic device, and the host device 50 is a data write machine in the factory. In Step 402, the flash memory controller 110 starts to receive data from the host device 50. In Step 404, the flash memory controller 110 determine the write mechanism, that is the flash memory controller 110 writes the data from the host device 50 to only one page of each word line of the blocks, only two pages of each word line of the blocks, or all of the three pages of each word line of the blocks. In this embodiment, the write mechanism can be determined by referring to a size of the data and a storage capacity of the flash memory module 120, and the write mechanism may be set by an engineer. In this embodiment, if the size of the data is less than one-third of the storage capacity of the flash memory module 120, only one page of the word line is used to store the data from the host device 50; if the size of the data is greater than one-third of the storage capacity and less than two-third of the flash memory module 120, only two pages of the word line are used to store the data from the host device 50; and if the size of the data is greater than two-third of the storage capacity of the flash memory module 120, all of the three pages of the word line are used to store the data from the host device 50. If the write mechanism indicates that only one page of the word line is used to store the data from the host device 50, the flow enters Step 406; and if the write mechanism indicates that only two pages of the word line are used to store the data from the host device 50, the flow enters Step 410.

In Step 406, the flash memory controller 110 generates dummy data corresponding to two pages of the word line according to the received data from the host device 50. In Step 408, for each of the word lines of a plurality of specific blocks for storing the data from the host device 50, the dummy data is written into two pages, and the data from the host device 50 is written into the other one page by using only two non-adjacent states of the memory cell, wherein the two non-adjacent states correspond to "0" and "1", respectively. Taking FIG. 3 as an example, the data from the host device 50 is written into the LSB page, and the state S0 having the value "1" and the state S5 having the value "0" can be selected as the above-mentioned two non-adjacent states (it is noted that, states S0 and S5 are not a limitation of the present invention, S0 and S6, or S3 and S7 . . . can be selected). At this time, if the receive data corresponding to a memory cell has the logical value "1", the flash memory controller 110 can generate the dummy data CSB=1 and MSB=1 to correspond to the state S0; and if the receive data have the logical value "0", the flash memory controller 110 can generate the dummy data CSB=1 and MSB=1 to correspond to the state S5. That is, in this embodiment, the data from the host device 50 is written into the LSB page of the word lines of the specific blocks, and the dummy data generated by the flash memory controller 110 is written into the CSB page and MSB page of the word lines of the specific blocks.

In addition, for any one of the specific blocks, a logical-to-physical (L2P) mapping table and/or a physical-to-logical (P2L) mapping table is/are established to record the mapping between the logical addresses and the physical addresses, and the L2P and/or the P2L table is/are written into a last page of the specific block. In this embodiment, because the dummy data generated by the flash memory controller 110 is written into the CSB page and MSB page of the word lines of the specific blocks, about only one-third of the physical addresses of the specific block correspond to valid logical addresses, and about two-third of the physical addresses of the specific block does not correspond to valid logical addresses.

In Step 410, the flash memory controller 110 generates dummy data corresponding to one page of the word line according to the received data from the host device 50. In Step 412, the dummy data is written into one page, and the data from the host device 50 is written into the other two pages by using only four states that are not adjacent to each other, wherein the four states correspond to (1, 1), (1, 0), (0, 0) and (0, 1) of the two pages, respectively, and. Taking FIG. 3 as an example, the data from the host device 50 is written into the LSB page and the MSB page, and the state S0 corresponding to (LSB=1, MSB=1), the state S2 corresponding to (LSB=1, MSB=0), the state S4 corresponding to (LSB=0, MSB=0), and the state S6 corresponding to (LSB=0, MSB=1) can be selected as the above-mentioned four states (it is noted that, not a limitation of the present invention. At this time, if the receive data corresponding to a memory cell has the values (LSB=1, MSB=1), the flash memory controller 110 can generate the dummy data CSB=1 correspond to the state S0; if the receive data corresponding to a memory cell has the values (LSB=1, MSB=0), the flash memory controller 110 can generate the dummy data CSB=0 correspond to the state S2; if the receive data corresponding to a memory cell has the values (LSB=0, MSB=0), the flash memory controller 110 can generate the dummy data CSB=1 correspond to the state S4; and if the receive data corresponding to a memory cell has the values (LSB=0, MSB=1), the flash memory controller 110 can generate the dummy data CSB=0 correspond to the state S6. That is, in this embodiment, the data from the host device 50 is written into the LSB page and the MSB page of the word lines of the specific blocks, and the dummy data generated by the flash memory controller 110 is written into the CSB page of the word lines of the specific blocks.

In addition, for any one of the specific blocks, the L2P and/or the P2L table is/are written into a last page of the specific block. In this embodiment, because the dummy data generated by the flash memory controller 110 is written into the CSB page of the word lines of the specific blocks, about only two-third of the physical addresses of the specific block correspond to valid logical addresses, and about one-third of the physical addresses of the specific block does not correspond to valid logical addresses.

In addition, if the write mechanism indicates that all of the three pages of the word line are used to store the data from the host device 50, the data is written into the flash memory module 120 by using the conventional art.

Figure 5:
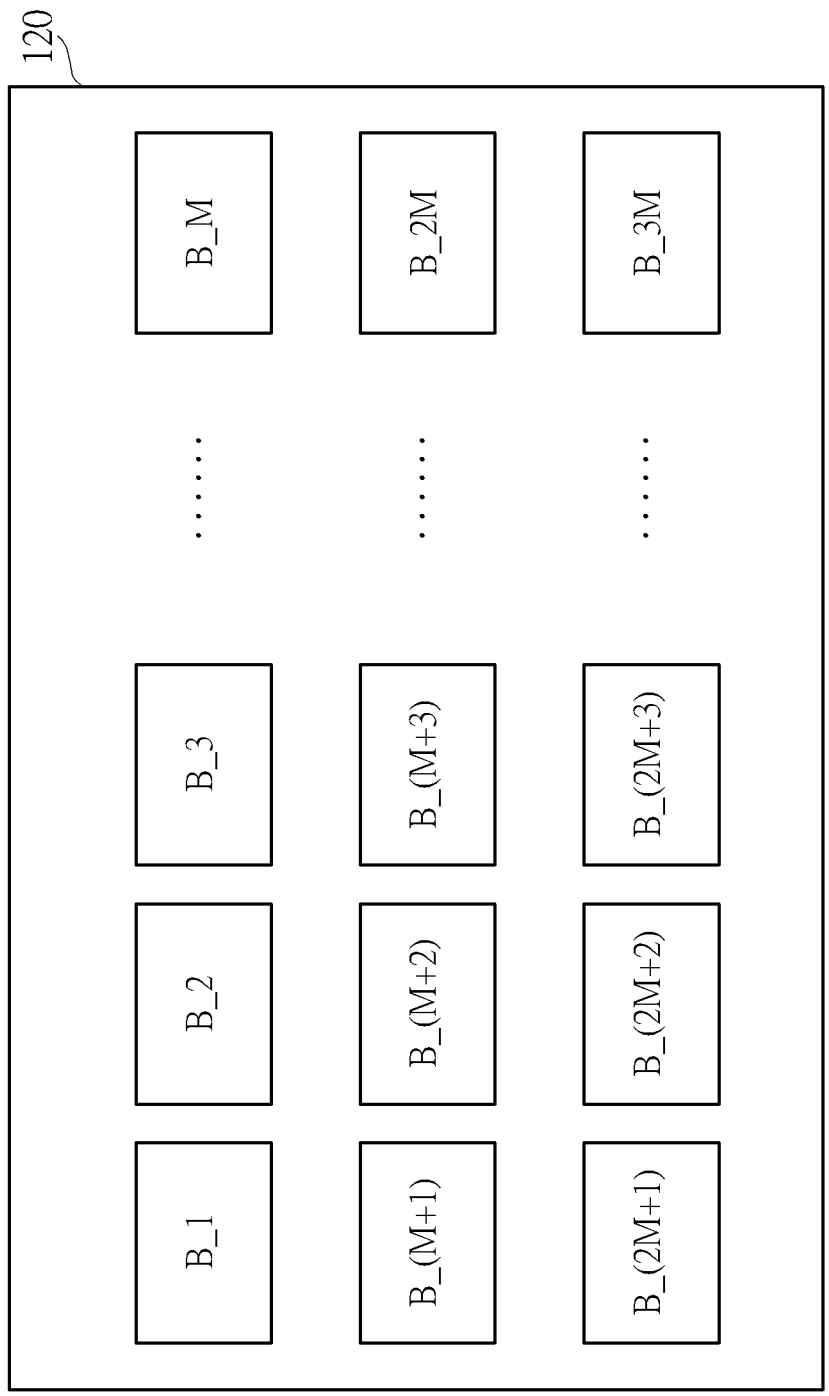
FIG. 5 shows a plurality of blocks within the flash memory module.

Briefly summarizing the Steps 404-412, most or all of the blocks of the flash memory module 120 can serve as the TLC blocks having higher data density, however, considering the memory device 100 may under the high temperature in the manufacturing process, the specific blocks for storing the data from the host device 50 are serves as the MLC blocks or SLC blocks with less states and higher data robustness, to avoid the data damage in the manufacturing process. FIG. 5 shows the blocks within flash memory module 120 according to one embodiment of the present invention. In FIG. 5, it is assumed that the number of the blocks is "3*M", and if the blocks B_1-B(M−1) serving as the TLC blocks can store all of the data received from the host device 50, the flash memory controller 110 can write the data into the specific blocks such as B_1-B_(2*M+X) while each specific block is served as the SLC block, where "X" can be any suitable value less than M. If the blocks B_1-B(M−1) serving as the TLC blocks it not enough for storing all of the data received from the host device 50, but the blocks B_1-B(2*M−1) serving as the TLC blocks can store all of the data received from the host device 50, the flash memory controller 110 can write the data into the specific blocks such as B_1-B_(2*M+X) while each block is served as the MLC block.

In Step 414, after the memory device 100 is positioned in the electronic device and the electronic device starts to work, that is the host device 50 shown in FIG. 1 becomes a processor or a chipset of the electronic device now, the flash memory controller performs a garbage collection operation on the flash memory module 120 to move valid data of a portion of the blocks to a plurality of blank blocks, to release space of the portion of the blocks, wherein the valid data of the portion of the specific blocks are written into all of the three pages of each word line of the blank blocks. Taking FIG. 5 as an example, if the specific blocks B_1-B_(2\*M+X) serving as the SLC blocks store the data from the host device 50, then the garbage collection operation can be performed to move the valid data from the blocks B_1-B_3 to the blank block B_(3\*M−1) serving as the TLC block, and move the valid data from the blocks B_4-B_6 to the blank block B_3\*M serving as the TLC block to increase the data density, and the blocks of the B1-B6 are erased to release the memory space.

It is noted that the purpose of arranging the specific blocks as the MLC blocks or SLC blocks for storing the data from the host device 50 is to increase data robustness to pass the high temperature process (e.g. the wave soldering process), and the portion of the specific blocks that are released by the garbage collection operation will be served as the TLC blocks in the further use. That is, after the blocks of the B1-B6 are erased to release the memory space, next time the blocks of the B1-B6 will be served as the TLC blocks for storing data from the host device 50. In this embodiment, the blocks of the B1-B6 serve as the SLC or MLC blocks only at the first data writing operation.

In one embodiment, the above garbage collection operation can be performed immediately after the electronic device is powered on in the first time by the user, that is after the user powers on the electronic device, the memory device 100 can actively schedule the garbage collection operation in an appropriate time.

In one embodiment, the flash memory controller can actively perform the garbage collection, even if quality of the blocks storing the data from the host device 50 is good enough to be no need to perform the garbage collection operation in a normal operation. On the other word, because the blocks are intentionally used as the SLC blocks or the MLC blocks in Steps 404-412, now the flash memory controller 110 sequentially rearrange the data to make a portion of the blocks become TLC blocks with higher data density.

Figure 6:
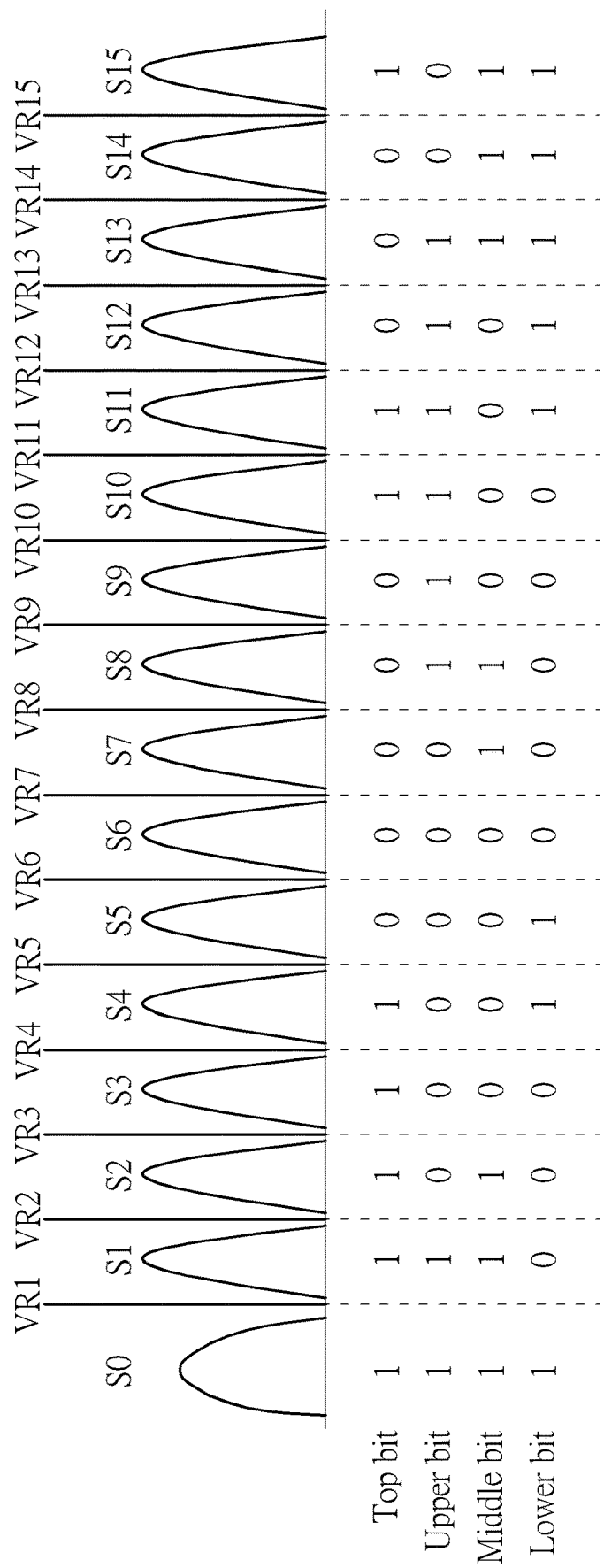
FIG. 6 is a diagram illustrating a plurality of states (program states) of a memory cell of the QLC block according to one embodiment of the present invention.

It is noted that the above-mentioned embodiment can also be applied to the flash memory module 120 having QLC blocks. FIG. 6 is a diagram illustrating a plurality of states (program states) of a memory cell of the QLC block according to one embodiment of the present invention. As shown in FIG. 6, each memory cell can have sixteen states, and each state represents different combinations of four bits that are named as a top bit, an upper bit, a middle bit and a lower bit. In the embodiment shown in FIG. 6, when the memory cell is programmed to have the state S0, the top bit, the upper bit, the middle bit and the lower bit stored in the memory cell are (1, 1, 1, 1); when the memory cell is programmed to have the state S1, the top bit, the upper bit, the middle bit and the lower bit stored in the memory cell are (1, 1, 1, 0); when the memory cell is programmed to have the state S2, the top bit, the upper bit, the middle bit and the lower bit stored in the memory cell are (1, 0, 1, 0); when the memory cell is programmed to have the state S3, the top bit, the upper bit, the middle bit and the lower bit stored in the memory cell are (1, 0, 0, 0); when the memory cell is programmed to have the state S4, the top bit, the upper bit, the middle bit and the lower bit stored in the memory cell are (1, 0, 0, 1); when the memory cell is programmed to have the state S5, the top bit, the upper bit, the middle bit and the lower bit stored in the memory cell are (0, 0, 0, 1); when the memory cell is programmed to have the state S6, the top bit, the upper bit, the middle bit and the lower bit stored in the memory cell are (0, 0, 0, 0); when the memory cell is programmed to have the state S7, the top bit, the upper bit, the middle bit and the lower bit stored in the memory cell are (0, 0, 1, 0); when the memory cell is programmed to have the state S8, the top bit, the upper bit, the middle bit and the lower bit stored in the memory cell are (0, 1, 1, 0); when the memory cell is programmed to have the state S9, the top bit, the upper bit, the middle bit and the lower bit stored in the memory cell are (0, 1, 0, 0); when the memory cell is programmed to have the state S10, the top bit, the upper bit, the middle bit and the lower bit stored in the memory cell are (1, 1, 0, 0); when the memory cell is programmed to have the state S11, the top bit, the upper bit, the middle bit and the lower bit stored in the memory cell are (1, 1, 0, 1); when the memory cell is programmed to have the state S12, the top bit, the upper bit, the middle bit and the lower bit stored in the memory cell are (0, 1, 0, 1); when the memory cell is programmed to have the state S13, the top bit, the upper bit, the middle bit and the lower bit stored in the memory cell are (0, 1, 1, 1); when the memory cell is programmed to have the state S14, the top bit, the upper bit, the middle bit and the lower bit stored in the memory cell are (0, 0, 1, 1); and when the memory cell is programmed to have the state S15, the top bit, the upper bit, the middle bit and the lower bit stored in the memory cell are (1, 0, 1, 1).

In the conventional art, when the top bit is required to be read by the flash memory controller 110, the flash memory controller 110 can control the flash memory module 120 to apply four read voltages VR5, VR10, VR12 and VR15 to read the memory cell. When the upper bit is required to be read by the flash memory controller 110, the flash memory controller 110 can control the flash memory module 120 to apply three read voltages VR2, VR8 and VR14 to read the memory cell. When the middle bit is required to be read by the flash memory controller 110, the flash memory controller 110 can control the flash memory module 120 to apply four read voltages VR3, VR7, VR9 and VR13 to read the memory cell. When the lower bit is required to be read by the flash memory controller 110, the flash memory controller 110 can control the flash memory module 120 to apply four read voltages VR1, VR4, VR6 and VR11 to read the memory cell.

Figure 7:
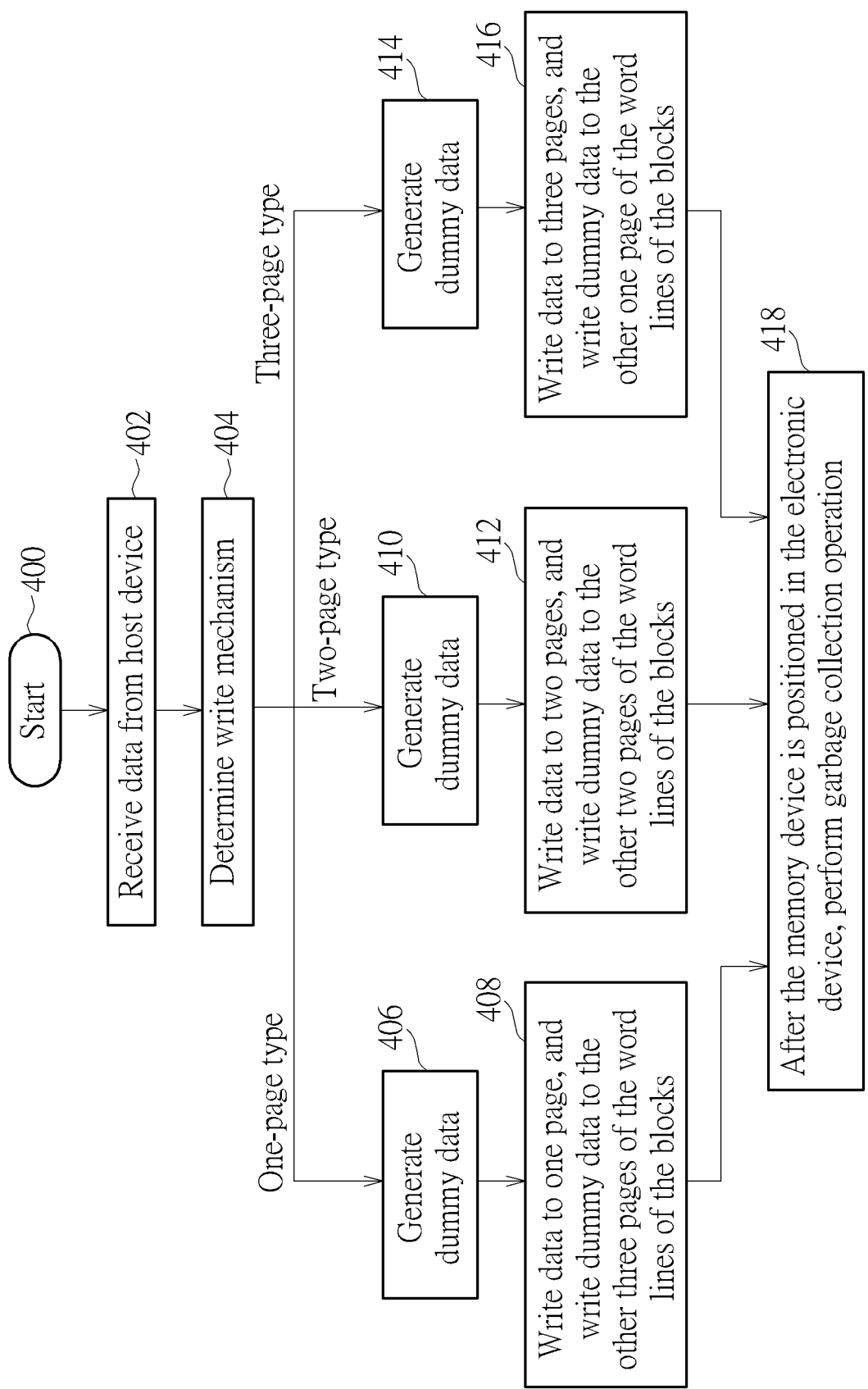
FIG. 7 is a diagram illustrating a method for accessing the flash memory module according to another embodiment of the present invention.

FIG. 7 is a diagram illustrating a method for accessing the flash memory module 120 according to another embodiment of the present invention. In Step 700, the flow starts, the memory device 100 is connected to the host device 50, and the host device 50 prepares to write data into the memory device 100. In this embodiment, the memory device 100 is not mounted on the PCB and not positioned in the electronic device, and the host device 50 is a data write machine in the factory. In Step 702, the flash memory controller 110 starts to receive data from the host device 50. In Step 474, the flash memory controller 110 determine the write mechanism, that is the flash memory controller 110 writes the data from the host device 50 to only one page of each word line of the blocks, only two pages of each word line of the blocks, only three pages of each word line of the blocks, or all of the four pages of each word line of the blocks. In this embodiment, the write mechanism can be determined by referring to a size of the data and a storage capacity of the flash memory module 120, and the write mechanism may be set by an engineer. In this embodiment, if the size of the data is less than one-fourth of the storage capacity of the flash memory module 120, only one page of the word line is used to store the data from the host device 50; if the size of the data is greater than one-fourth of the storage capacity and less than two-fourth of the flash memory module 120, only two pages of the word line are used to store the data from the host device 50; if the size of the data is greater than two-fourth of the storage capacity and less than three-fourth of the flash memory module 120, only two pages of the word line are used to store the data from the host device 50; and if the size of the data is greater than three-fourth of the storage capacity of the flash memory module 120, all of the four pages of the word line are used to store the data from the host device 50. If the write mechanism indicates that only one page of the word line is used to store the data from the host device 50, the flow enters Step 706; if the write mechanism indicates that only two pages of the word line are used to store the data from the host device 50, the flow enters Step 710; and if the write mechanism indicates that only three pages of the word line are used to store the data from the host device 50, the flow enters Step 714.

In Step 706, the flash memory controller 110 generates dummy data corresponding to three pages of the word line according to the received data from the host device 50. In Step 708, for each of the word lines of a plurality of specific blocks for storing the data from the host device 50, the dummy data is written into three pages, and the data from the host device 50 is written into the other one page by using only two non-adjacent states of the memory cell, wherein the two non-adjacent states correspond to "0" and "1", respectively. In Step 710, the flash memory controller 110 generates dummy data corresponding to two pages of the word line according to the received data from the host device 50. In Step 712, the dummy data is written into two pages, and the data from the host device 50 is written into the other two pages by using only four states that are not adjacent to each other. In Step 714, the flash memory controller 110 generates dummy data corresponding to one page of the word line according to the received data from the host device 50. In Step 716, the dummy data is written into three pages, and the data from the host device 50 is written into the other two pages by using only eight states that are not adjacent to each other.

In addition, if the write mechanism indicates that all of the four pages of the word line are used to store the data from the host device 50, the data is written into the flash memory module 120 by using the conventional art.

Briefly summarizing the Steps 704-716, most or all of the blocks of the flash memory module 120 can serve as the QLC blocks having higher data density, however, considering the memory device 100 may under the high temperature in the manufacturing process, the specific blocks for storing the data from the host device 50 are serves as the TLC blocks, MLC blocks or SLC blocks with less states and higher data robustness, to avoid the data damage in the manufacturing process.

In Step 718, after the memory device 100 is positioned in the electronic device and the electronic device starts to work, that is the host device 50 shown in FIG. 1 becomes a processor or a chipset of the electronic device now, the flash memory controller performs a garbage collection operation on the flash memory module 120 to move valid data of a portion of the blocks to a plurality of blank blocks, to release space of the portion of the blocks, wherein the valid data of the portion of the specific blocks are written into all of the four pages of each word line of the blank blocks.

Briefly summarized, in the present invention, the eMMC can be controlled to arrange the blocks of the flash memory module as SLB blocks or MLC blocks with less states and higher data robustness. After the eMMC is mounted on the PCB and under the normal temperature, the garbage collection operation is performed to increase the data density and release the memory space. Therefore, the flow of the eMMC becomes well.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for accessing a flash memory module, wherein the flash memory module comprises at least one flash memory chip, each flash memory chip comprises a plurality of block, each block is implemented by a plurality of word lines, each word line corresponds to K pages, K is equal to or greater than three, and each word line comprises a plurality of memory cells supporting a plurality of states, and the method comprises the steps of:
   receiving data from a host device;
   determining a ratio between a size of dummy data and a size of the data from the host device according to a size of the data from the host device and a storage capacity of all of the blocks of the flash memory module;
   generating the dummy data according to the determined ratio between the size of dummy data and the size of the data from the host device;
   writing the data with the dummy data to a plurality of specific blocks, wherein for each of a portion of the word lines of the specific blocks, the dummy data is written into at least one of the K pages, and the data from the host device is written into the other page(s) of the K pages, so that the plurality of specific blocks serve as single-level cell (SLC) blocks or multiple-level cell (MLC) blocks;
   performing a garbage collection operation on the flash memory module to release space of at least a portion of the specific blocks; and
   writing other data from the host device to all of the K pages of each word line of the portion of the specific blocks, so that the portion of the specific blocks serve as triple-level cell (TLC) blocks or quad-level cell (QLC) blocks.

2. The method of claim 1, wherein K is equal to three, and the step of writing the data with the dummy data to the plurality of specific blocks comprises:
   in response to the size of the data being less than one-third of the storage capacity of the flash memory module, for each of the portion of the word lines of the specific blocks, the dummy data is written into two pages, and the data from the host device is written into the other one of the three pages; and
   in response to the size of the data being greater than one-third of the storage capacity and less than two-third of the flash memory module, for each of the portion of the word lines of the specific blocks, the dummy data is written into one page, and the data from the host device is written into the other two of the three pages.

3. The method of claim 2, wherein each memory supports eight states, and the step of writing the data with the dummy data to the plurality of specific blocks comprises:
   in response to the size of the data being less than one-third of the storage capacity of the flash memory module, for each of the portion of the word lines of the specific blocks, the dummy data is written into two pages, and the data from the host device is written into the other one page by using only two non-adjacent states of the memory cells; and in response to the size of the data being greater than one-third of the storage capacity and less than two-third of the flash memory module, for each of the portion of the word lines of the specific blocks, the dummy data is written into one page, and the data from the host device is written into the other two pages by using only four states that are not adjacent to each other.

4. The method of claim 1, wherein K is equal to four, and the step of writing the data with the dummy data to the plurality of specific blocks comprises:

in response to the size of the data being less than one-fourth of the storage capacity of the flash memory module, for each of the portion of the word lines of the specific blocks, the dummy data is written into three pages, and the data from the host device is written into the other one of the four pages;

in response to the size of the data being greater than one-fourth of the storage capacity and less than two-fourth of the flash memory module, for each of the portion of the word lines of the specific blocks, the dummy data is written into two pages, and the data from the host device is written into the other two of the four pages; and in response to the size of the data being greater than two-fourth of the storage capacity and less than three-fourth of the flash memory module, for each of the portion of the word lines of the specific blocks, the dummy data is written into one page, and the data from the host device is written into the other three of the four pages.

5. The method of claim 4, wherein each memory supports sixteen states, and the step of writing the data with the dummy data to the plurality of specific blocks comprises:

in response to the size of the data being less than one-fourth of the storage capacity of the flash memory module, for each of the portion of word lines of the specific blocks, the dummy data is written into three pages, and the data from the host device is written into the other one of the four pages by using only two non-adjacent states of the memory cells;

in response to the size of the data being greater than one-fourth of the storage capacity and less than two-fourth of the flash memory module, for each of the portion of the word lines of the specific blocks, the dummy data is written into two pages, and the data from the host device is written into the other two of the four pages by using only four states that are not adjacent to each other; and in response to the size of the data being greater than two-fourth of the storage capacity and less than three-fourth of the flash memory module, for each of the portion of the word lines of the specific blocks, the dummy data is written into one page, and the data from the host device is written into the other three of the four pages by using only eight states that are not adjacent to each other.

6. The method of claim 1, wherein the method is executed by an embedded Multi-Media-Card (eMMC) comprising a flash memory controller and the flash memory module, and the receiving step, the generating step and the writing step are performed before the eMMC is positioned in an electronic device.

7. The method of claim 6, wherein the receiving step, the generating step and the writing step are performed before the eMMC is mounted on a printed circuit board (PCB) applied to the electronic device.

8. The method of claim 6, further comprising:

after the eMMC is positioned in the electronic device and the electronic device starts to work, performing the garbage collection operation on the flash memory module to move valid data of the portion of the specific blocks to a plurality of blank blocks, to release space of the portion of the specific blocks;

wherein the valid data of the portion of the specific blocks are written into all of the K pages of each word line of the blank blocks.

9. The method of claim 8, wherein the step of performing the garbage collection operation on the flash memory module to move the valid data of the portion of the specific blocks to the plurality of blank blocks comprises:

after the eMMC is positioned in the electronic device and the electronic device starts to work, performing the garbage collection operation on the flash memory module to move the valid data of the portion of the specific blocks to the plurality of blank blocks, even if quality of the portion of the specific blocks is good enough to be no need to perform the garbage collection operation in a normal operation of the eMMC.

10. The method of claim 1, wherein the data from the host device comprises a boot code, an operating system (OS) code, and digital contents.

11. A package, comprising:

a flash memory module, wherein the flash memory module comprises at least one flash memory chip, each flash memory chip comprises a plurality of block, each block is implemented by a plurality of word lines, each word line corresponds to K pages, K is equal to or greater than three, and each word line comprises a plurality of memory cells supporting a plurality of states; and a flash memory controller, coupled to the flash memory module, configured to receive data from a host device, generate dummy data according to the data received from the host device, and write the data with the dummy data to a plurality of specific blocks;

wherein for each of a portion of the word lines of the specific blocks, the dummy data is written into at least one of the K pages, and the data from the host device is written into the other page(s) of the K pages, so that the plurality of specific blocks serve as single-level cell (SLC) blocks or multiple-level cell (MLC) blocks;

wherein a ratio between a size of the dummy data and a size of the data from the host device is determined according to a size of the data from the host device and a storage capacity of all of the blocks of the flash memory module;

wherein the flash memory controller performs a garbage collection operation on the flash memory module to release space of at least a portion of the specific blocks, and writes other data from the host device to all of the K pages of each word line of the portion of the specific blocks, so that the portion of the specific blocks serve as triple-level cell (TLC) blocks or quad-level cell (QLC) blocks.

12. The package of claim 11, wherein K is equal to three, and in response to the size of the data being less than one-third of the storage capacity of the flash memory module, for each of the portion of the word lines of the specific blocks, the dummy data is written into two pages, and the data from the host device is written into the other one of the three pages; and in response to the size of the data being greater than one-third of the storage capacity and less than two-third of the flash memory module, for each of the portion of the word lines of the specific blocks, the dummy data is written into one page, and the data from the host device is written into the other two of the three pages.

13. The package of claim 12, wherein each memory supports eight states, and in response to the size of the data being less than one-third of the storage capacity of the flash memory module, for each of the portion of the word lines of the specific blocks, the dummy data is written into two pages, and the data from the host device is written into the other one page by using only two non-adjacent states of the memory cells; in response to the size of the data being greater than one-third of the storage capacity and less than two-third of the flash memory module, for each of the portion of the word lines of the specific blocks, the dummy data is written into one page, and the data from the host device is written into the other two pages by using only four states that are not adjacent to each other.

14. The package of claim 11, wherein K is equal to four, and in response to the size of the data being less than one-fourth of the storage capacity of the flash memory module, for each of the portion of the word lines of the specific blocks, the dummy data is written into three pages, and the data from the host device is written into the other one of the four pages; in response to the size of the data being greater than one-fourth of the storage capacity and less than two-fourth of the flash memory module, for each of the portion of the word lines of the specific blocks, the dummy data is written into two pages, and the data from the host device is written into the other two of the four pages; and in response to the size of the data being greater than two-fourth of the storage capacity and less than three-fourth of the flash memory module, for each of the portion of the word lines of the specific blocks, the dummy data is written into one page, and the data from the host device is written into the other three of the four pages.

15. The package of claim 14, wherein each memory supports sixteen states, and in response to the size of the data being less than one-fourth of the storage capacity of the flash memory module, for each of the portion of the word lines of the specific blocks, the dummy data is written into three pages, and the data from the host device is written into the other one of the four pages by using only two non-adjacent states of the memory cells; in response to the size of the data being greater than one-fourth of the storage capacity and less than two-fourth of the flash memory module, for each of the portion of the word lines of the specific blocks, the dummy data is written into two pages, and the data from the host device is written into the other two of the four pages by using only four states that are not adjacent to each other; and in response to the size of the data being greater than two-fourth of the storage capacity and less than three-fourth of the flash memory module, for each of the portion of the word lines of the specific blocks, the dummy data is written into one page, and the data from the host device is written into the other three of the four pages by using only eight states that are not adjacent to each other.

16. The package of claim 11, wherein the package is an embedded Multi-Media-Card (eMMC), and flash memory controller writes the data with the dummy data to the specific blocks before the eMMC is positioned in an electronic device.

17. The package of claim 16, wherein after the eMMC is positioned in the electronic device and the electronic device starts to work, the flash memory controller performs the garbage collection operation on the flash memory module to move valid data of the portion of the specific blocks to a plurality of blank blocks, to release space of the portion of the specific blocks; wherein the valid data of the portion of the specific blocks are written into at all of the K pages of each word line of the blank blocks.

18. The package of claim 16, wherein after the eMMC is positioned in the electronic device and the electronic device starts to work, performing the garbage collection operation on the flash memory module to move the valid data of the portion of the specific blocks to the plurality of blank blocks, even if quality of the portion of the specific blocks is good enough to be no need to perform the garbage collection operation in a normal operation of the eMMC.

* * * * *